(12) United States Patent
Tang et al.

(10) Patent No.: US 7,989,916 B2
(45) Date of Patent: Aug. 2, 2011

(54) INTEGRATED CAPACITORS IN PACKAGE-LEVEL STRUCTURES, PROCESSES OF MAKING SAME, AND SYSTEMS CONTAINING SAME

(75) Inventors: John J. Tang, Shanghai (CN); Xiang Yin Zeng, Shanghai (CN); Jiangqi He, Gilbert, AZ (US); Ding Hai, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/590,547

(22) Filed: Nov. 10, 2009

(65) Prior Publication Data

US 2010/0059858 A1 Mar. 11, 2010

Related U.S. Application Data

(62) Division of application No. 11/323,312, filed on Dec. 30, 2005, now Pat. No. 7,670,919.

(51) Int. Cl.
*H01L 21/02* (2006.01)
(52) U.S. Cl. .................. 257/532; 257/E29.342
(58) Field of Classification Search .......... 257/532, 257/E29.342
See application file for complete search history.

(56) References Cited

U.S. PATENT DOCUMENTS

| | | | |
|---|---|---|---|
| 5,245,505 A | 9/1993 | Shiga et al. | |
| 6,023,407 A | 2/2000 | Farooq et al. | |
| 6,108,212 A | 8/2000 | Lach et al. | |
| 6,316,828 B1 | 11/2001 | Tao et al. | |
| 6,407,929 B1 | 6/2002 | Hale et al. | |
| 6,424,034 B1 | 7/2002 | Ahn et al. | |
| 6,667,207 B2 | 12/2003 | Ballantine et al. | |
| 6,706,584 B2 | 3/2004 | List et al. | |
| 6,781,185 B2 | 8/2004 | Chen et al. | |
| 6,818,469 B2 | 11/2004 | Mori et al. | |
| 6,888,716 B2 | 5/2005 | List et al. | |
| 7,027,289 B2 | 4/2006 | He et al. | |
| 7,506,435 B2 * | 3/2009 | Hung et al. | 29/832 |
| 2003/0088978 A1 | 5/2003 | Takano et al. | |
| 2004/0121266 A1 | 6/2004 | Lee et al. | |
| 2004/0170006 A9 | 9/2004 | Sylvester et al. | |
| 2005/0133903 A1 | 6/2005 | Palanduz | |
| 2006/0081998 A1 | 4/2006 | Zeng et al. | |
| 2006/0113631 A1 * | 6/2006 | Yang et al. | 257/532 |
| 2006/0170093 A1 | 8/2006 | Pendse | |

FOREIGN PATENT DOCUMENTS

| | | |
|---|---|---|
| WO | 01/06818 A1 | 1/2001 |
| WO | 2007/078714 A2 | 7/2007 |
| WO | 2007/078714 A3 | 7/2007 |

OTHER PUBLICATIONS

International Preliminary Report on Patentability for PCT Patent Application No. PCT/2006/047331, Dated Jul. 10, 2008, 10 pages.
International Search Report and written Opinion for for PCT Application No. PCT/2006/047331, Dated Aug. 21, 2007, 16 pages.

* cited by examiner

*Primary Examiner* — Trung Dang
(74) *Attorney, Agent, or Firm* — John N. Greaves

(57) ABSTRACT

An article includes a top electrode that is embedded in a solder mask. An article includes a top electrode that is on a core structure. A process of forming the top electrode includes reducing the solder mask thickness and forming the top electrode on the reduced-thickness solder mask. A process of forming the top electrode includes forming the top electrode over a high-K dielectric that is in a patterned portion of the core structure.

22 Claims, 10 Drawing Sheets

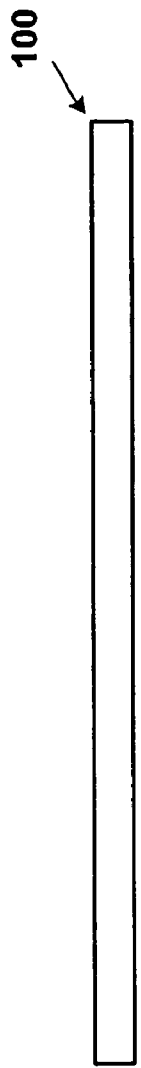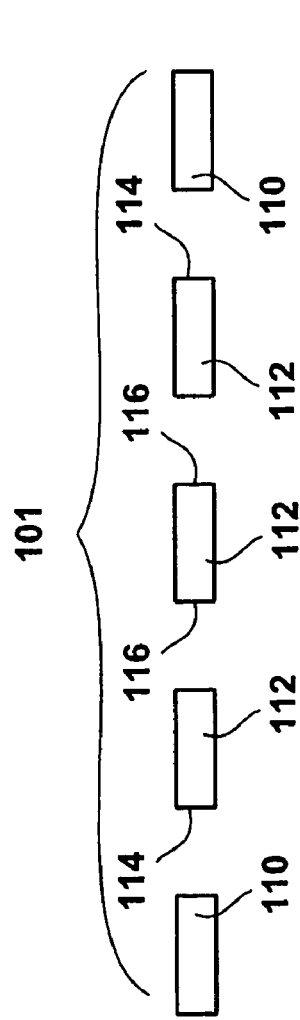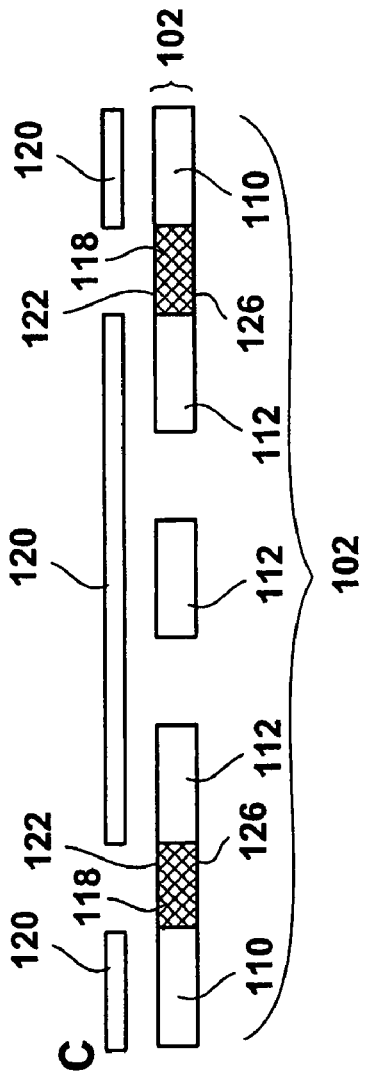

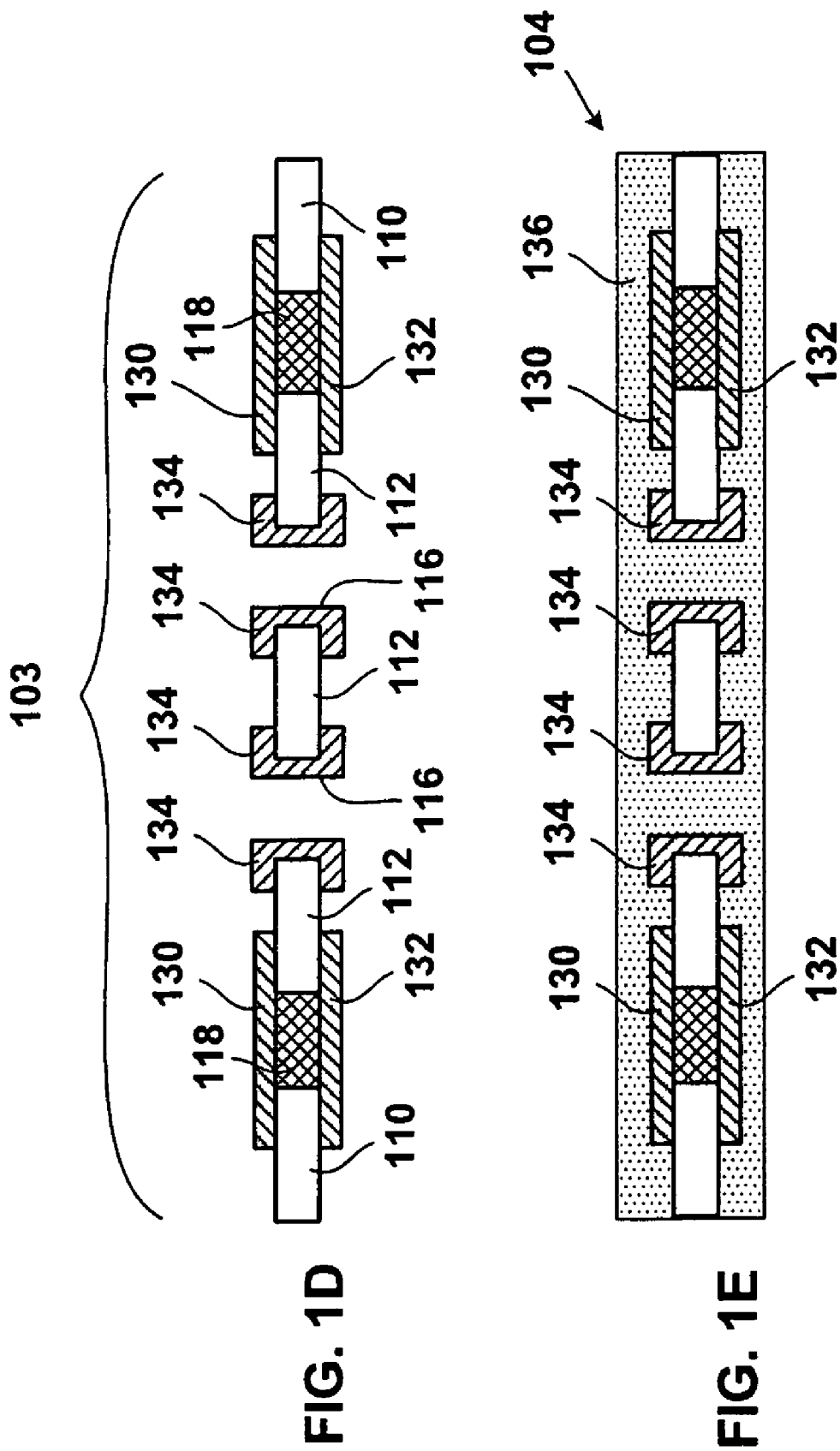

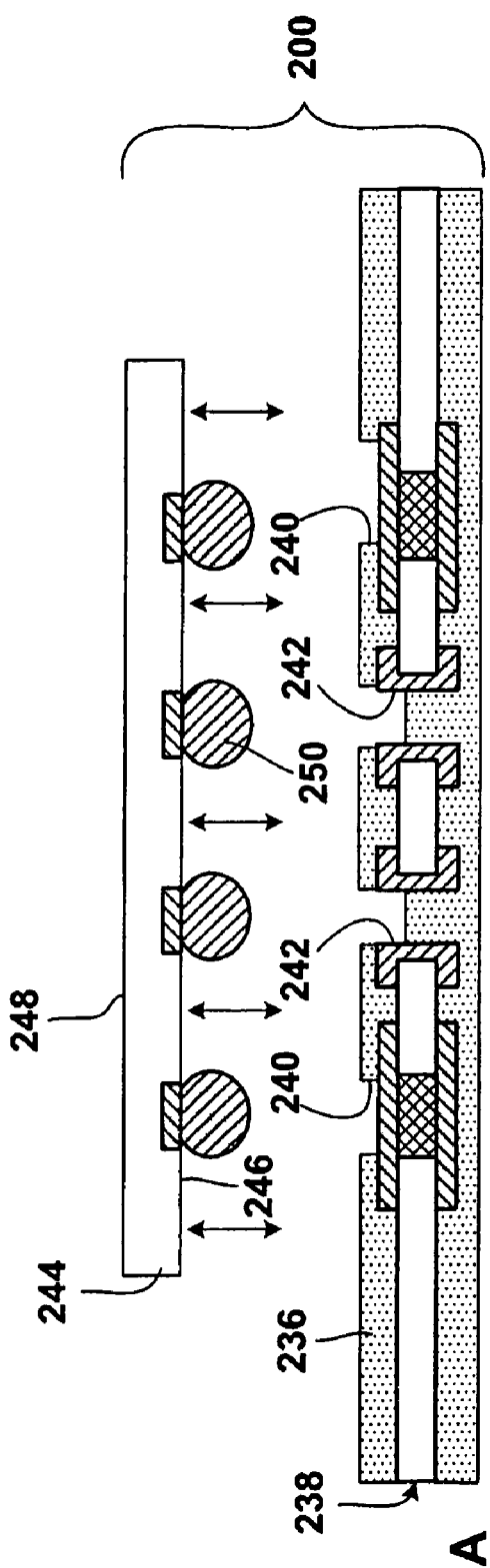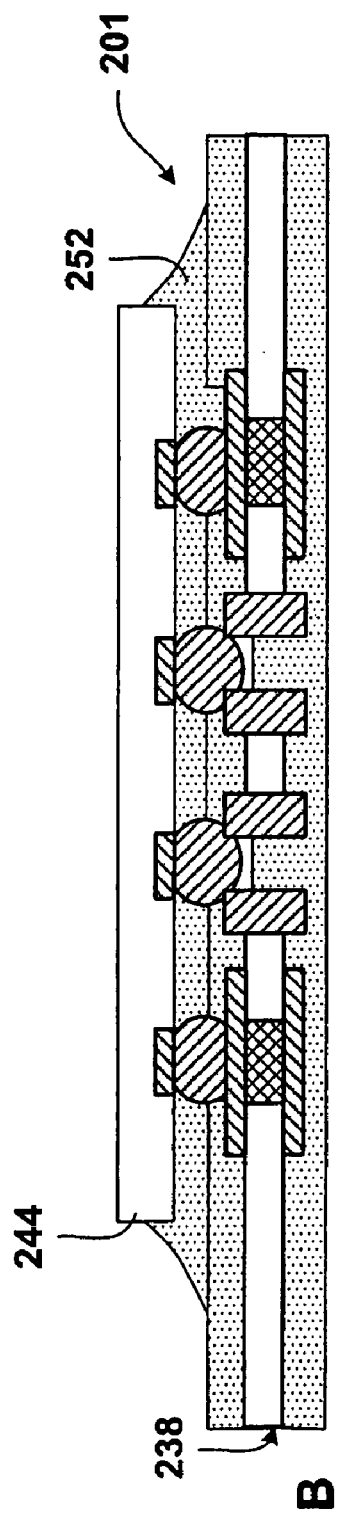
FIG. 2A
FIG. 2B

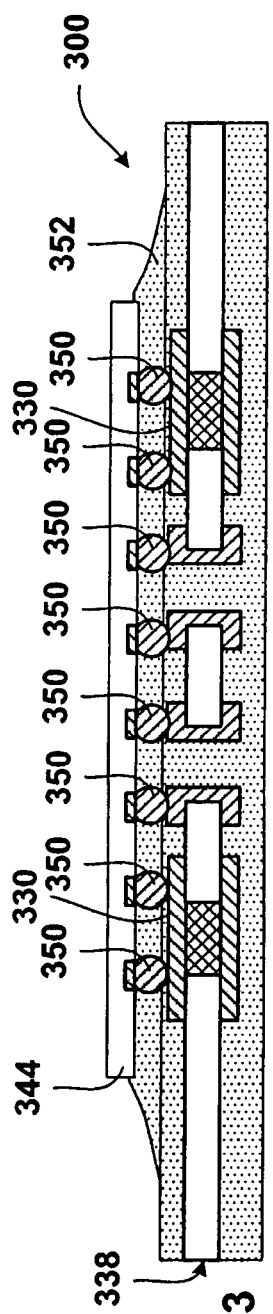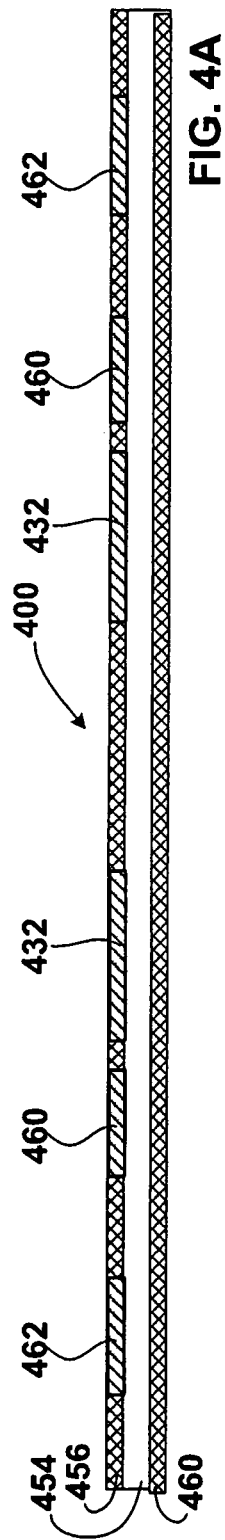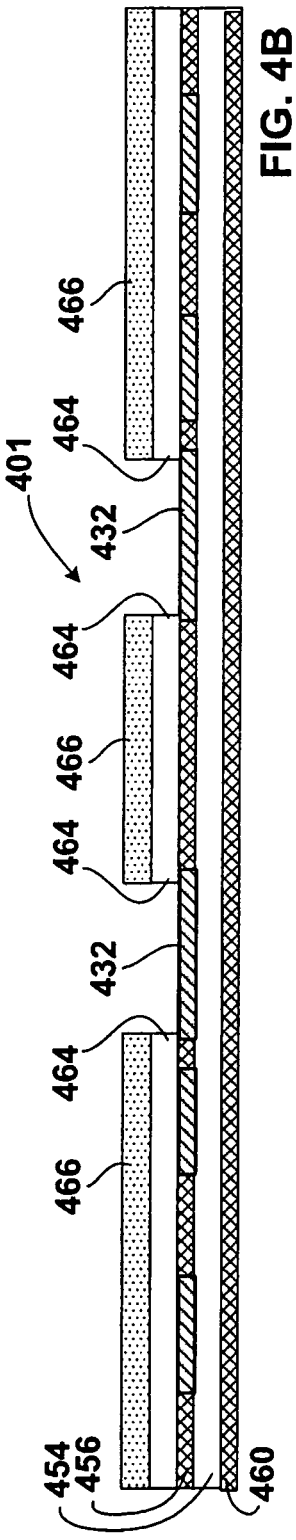

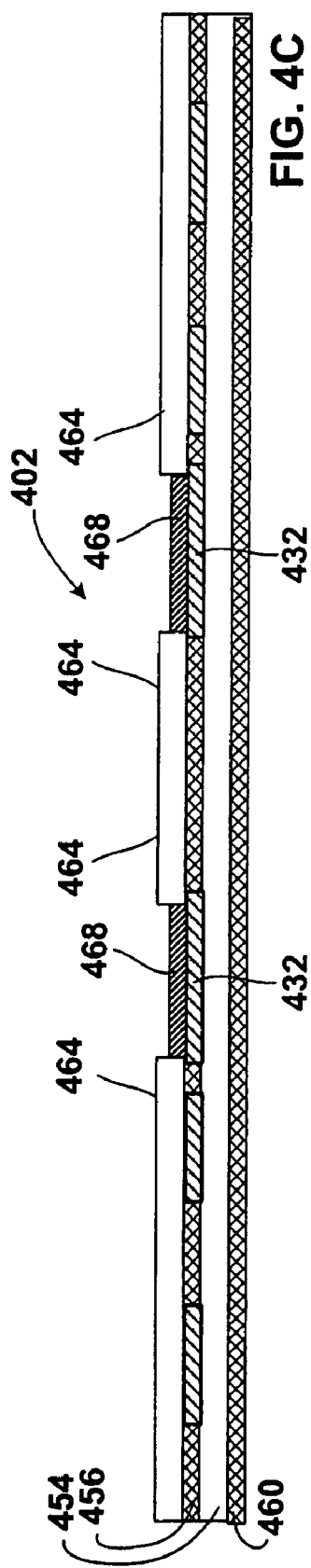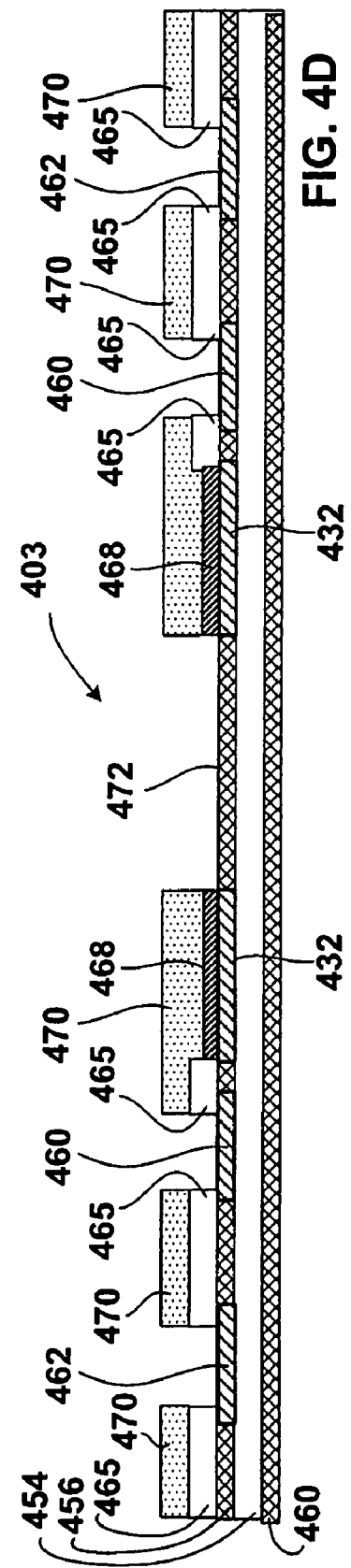

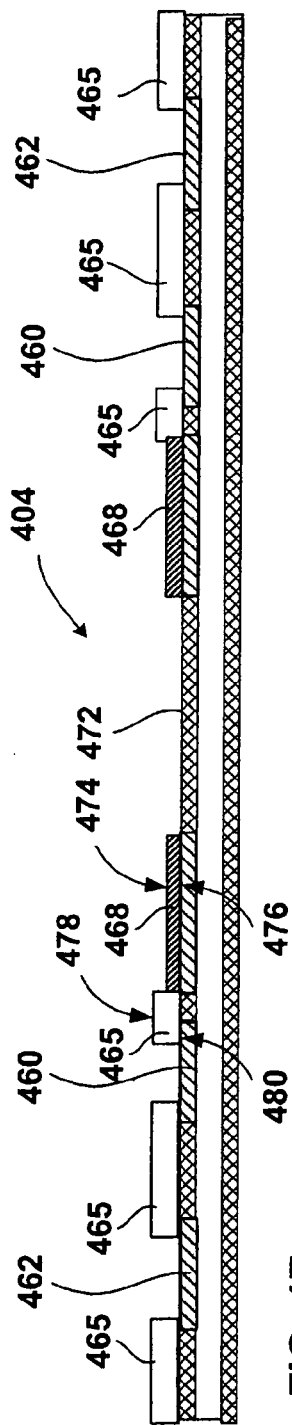
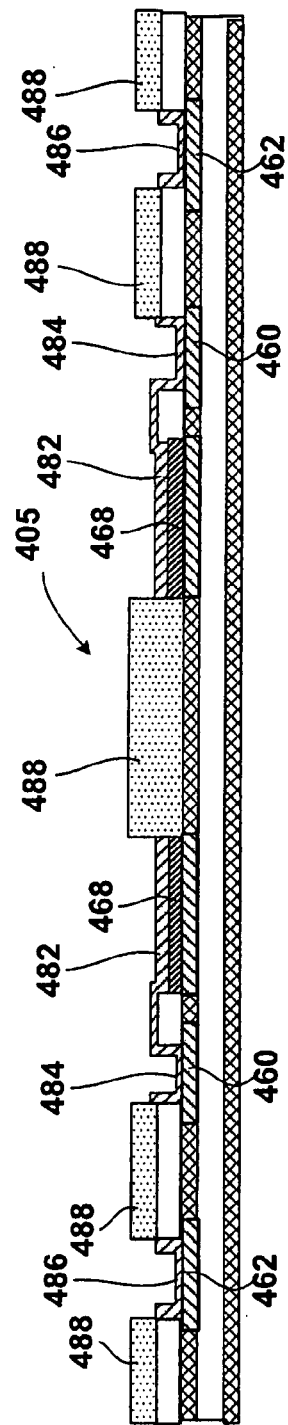
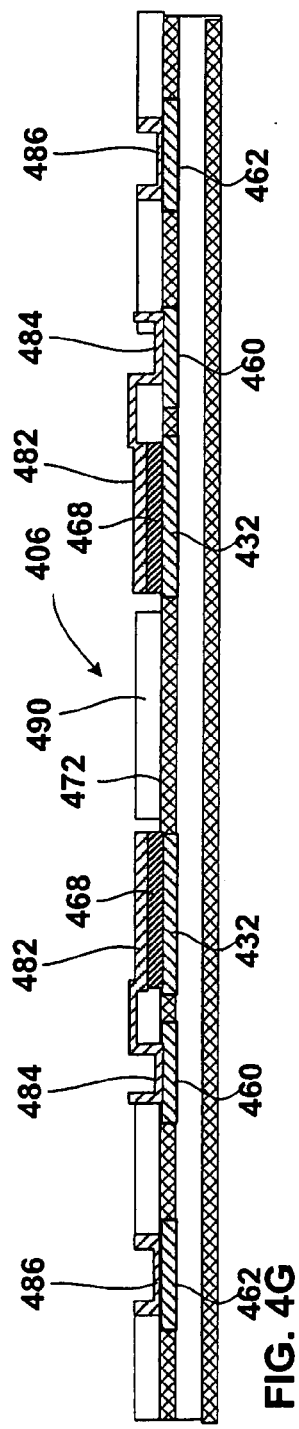
FIG. 4E
FIG. 4F
FIG. 4G

INTEGRATED CAPACITORS IN PACKAGE-LEVEL STRUCTURES, PROCESSES OF MAKING SAME, AND SYSTEMS CONTAINING SAME

This application claims priority to and is a divisional of U.S. patent application Ser. No. 11/323,312 entitled "INTEGRATED CAPACITORS IN PACKAGE-LEVEL STRUCTURES, PROCESSES OF MAKING SAME, AND SYSTEMS CONTAINING SAME", filed on Dec. 30, 2005, which is incorporated by reference in its entirety herein.

TECHNICAL FIELD

Embodiments relate generally to capacitors in chip packages.

TECHNICAL BACKGROUND

Passive devices such as capacitors, inductors, and resistors are of increasing importance in integrated circuit (IC) chip packages. For example, capacitors serve functions of decoupling, responding to processor loads, radio frequency (RF) applications of tuning and modulation, and others. Miniature passive RF devices are coming under increasing pressure to obtain a smaller and smaller package for user convenience. Consequently, capacitors and other passive RF devices are hard to locate in these small packages.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which:

FIG. 1A is a cross-section elevation of a core support structure for a die during processing according to an embodiment;

FIG. 1B is a cross-section elevation of the core support structure depicted in FIG. 1A after patterning according to an embodiment;

FIG. 1C is a cross-section elevation of the core support structure depicted in FIG. 1B after stenciling and applying a dielectric film according to an embodiment;

FIG. 1D is a cross-section elevation of the core support structure depicted in FIG. 1C after formation of top and bottom electrodes and plated through-holes according to an embodiment;

FIG. 1E is a cross-section elevation of the core support structure depicted in FIG. 1D after formation of a solder mask layer according to an embodiment;

FIG. 2A is an elevational cross-section of a chip package during assembly with an embedded-in-core capacitor according to an embodiment;

FIG. 2B is the elevational cross-section the chip package depicted in FIG. 2A after processing according to an embodiment;

FIG. 3 is an elevational cross-section of a chip package with an embedded-in-core capacitor according to an embodiment;

FIG. 4A is a cross-section elevation of a wire-bond mounting substrate during processing according to an embodiment;

FIG. 4B is a cross-section elevation of the wire-bond mounting substrate depicted in FIG. 4A after preparing a solder-mask film according to an embodiment;

FIG. 4C is a cross-section elevation of the wire-bond mounting substrate depicted in FIG. 4B after patterning the solder-mask film according to an embodiment;

FIG. 4D is a cross-section elevation of the wire-bond mounting substrate depicted in FIG. 4C after height reduction of a portion of the solder-mask structure according to an embodiment;

FIG. 4E is a cross-section elevation of the core support structure depicted in FIG. 4D that exposes the height-reduced solder mask and a die land according to an embodiment;

FIG. 4F is a cross-section elevation of the core support structure depicted in FIG. 4E after further processing to form a top electrode and to seat a die at the die land according to an embodiment;

FIG. 4G is a cross-section elevation of the core support structure depicted in FIG. 4E after further processing according to an embodiment;

DETAILED DESCRIPTION

Figure 5:
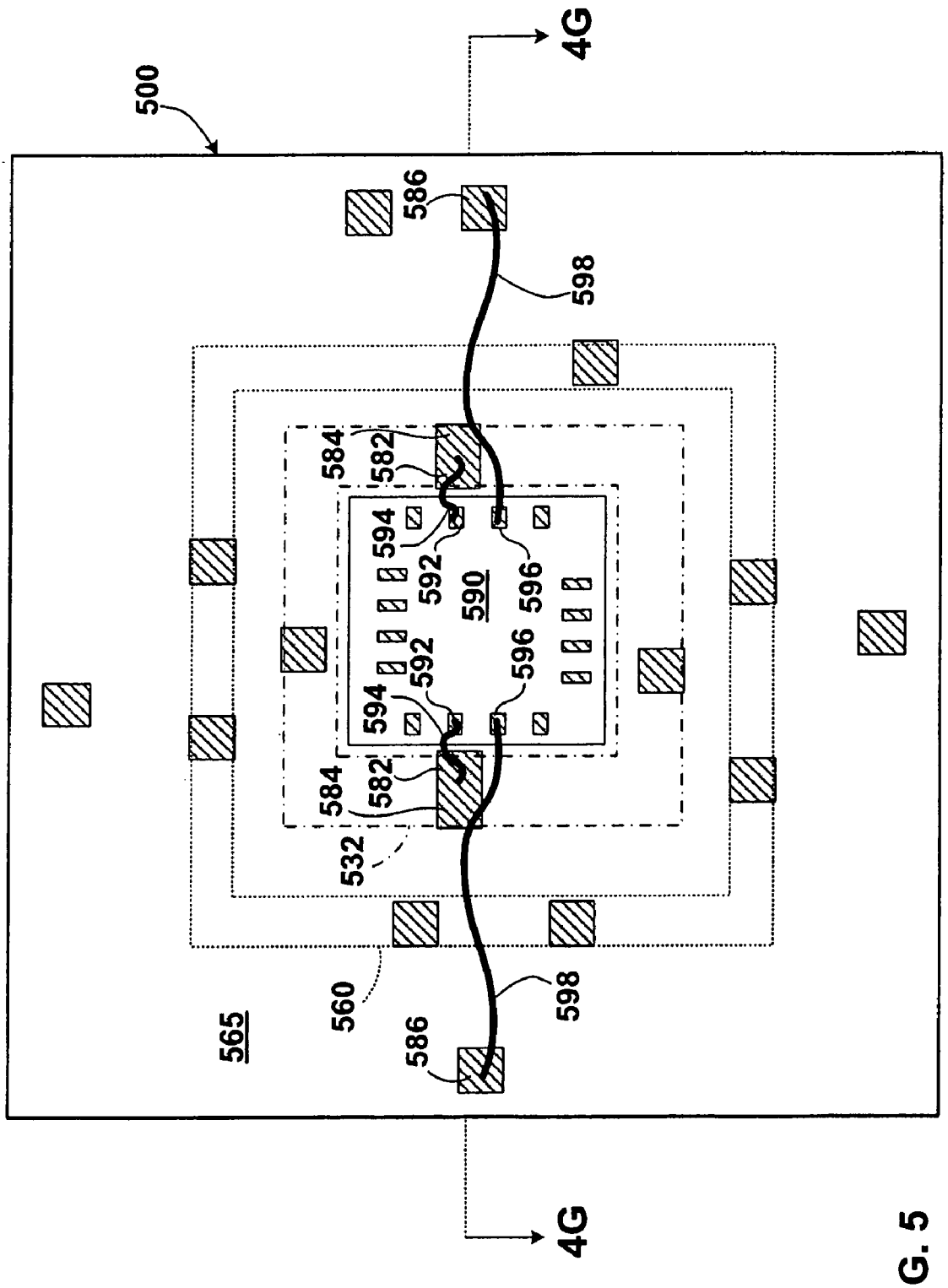
FIG. 5 is a top plan of a solder-mask embedded capacitor in a substrate, taken from FIG. 4F according to an embodiment.

Embodiments in this disclosure relate embedded passive devices that are located within solder mask structures and core structures. An embodiment includes capacitors that include a top electrode in a solder mask structure. The solder mask structure is modified to allow for a zero-profile capacitor within the existing solder mask structure. Similarly, the core structure is modified to allow for a zero-profile capacitor adjacent to a plated through hole.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

FIG. 1A is a cross-section elevation of a core support structure 100 for a die during processing according to an embodiment. The core support structure (hereinafter, "core structure") 100 is an organic-inorganic composite according to an embodiment. The core structure 100 is a stiff organic such as an FR4-resin impregnated fiberglass according to an embodiment. The core structure 100 is combination of organic and inorganic according to an embodiment, such as bismalde triazine (BT) material.

FIG. 1B is a cross-section elevation of the core support structure 100 depicted in FIG. 1A after patterning according to an embodiment. The patterned core structure 101 includes a peripheral patterned structural layer 110 and an internal patterned structural layer 112. A first recess 114 is prepared adjacent the peripheral patterned structural layer 110 for receiving a dielectric film. The patterned core structure 101 also includes a second recess 116, which is prepared for a plated through-hole (PTH) that will be subsequently fabricated.

FIG. 1C is a cross-section elevation of the core support structure 101 depicted in FIG. 1B after stenciling and applying a dielectric film 118 according to an embodiment. A stencil layer 120 is placed over the core structure 102 and a dielectric film 118 is flowed through the stencil opens to fill each occurrence of the first recess 114.

In an embodiment, the core structure 102 after formation of the dielectric film 118 exhibits a dielectric first surface 122 and a core first surface 124 that are substantially coplanar. Similarly in an embodiment, the core structure 102 after formation of the dielectric film 118 exhibits a dielectric second surface 126 and a core second surface 128 that are substantially coplanar. According to claimed embodiments, the core structure 102 is also referred to as a structural layer 102.

After stenciling or otherwise forming the dielectric film 118 in the first recess 114, the dielectric film 118 is cured or at least B-staged to achieve sufficient stability for further processing of the core structure 102. In an embodiment, the dielectric film 118 is a high-K material that has a permittivity, $E_r$, of about 20 (which exhibits about 17.7 picoFarads/mm$^2$ (pF/mm$^2$)). In an embodiment, the dielectric film 118 has an $E_r$ of about 50 (44 pF/mm$^2$). In an embodiment, the dielectric film 118 has an $E_r$ in a range from about 15 to about of about 60.

FIG. 1D is a cross-section elevation of the core support structure 102 depicted in FIG. 1C after formation of a top electrode 130 and a bottom electrode 132 and a plated through-hole (PTH) 134 according to an embodiment. The process to form the electrodes and structural layers can be carried out in several stages. For example, the top electrode 130 and the portion of the PTH 134 that is at or near the core first surface 124, is formed by electroless plating a seed layer over the dielectric first surface 122 and the core first surface 124. Thereafter, an electroplating process is carried out to achieve a design thickness of the top electrode 130 that will result in a given thickness of the PTH 134 that is at or near the core first surface 124. Thereafter, the core structure 103 is plated on the dielectric second surface 126 and the core second surface 128. Consequently, the PTH 134 that fills the second recess 116 may have a plating seam therein.

FIG. 1E is a cross-section elevation of the core support structure 103 depicted in FIG. 1D after formation of a solder mask layer 136 according to an embodiment. In an embodiment, the solder mask layer 136 serves both as a solder mask and as an encapsulation layer that is disposed over at least one of the top electrode 130 and the bottom electrode 132. The core support 104 is covered with the solder mask layer 136 in preparation for patterning and applying it to a microelectronic device such as a processor or an application-specific integrated circuit (ASIC) for an RF application, or others.

FIG. 2A is an elevational cross-section of a chip package 200 during assembly with an embedded-in-core capacitor according to an embodiment. The chip package 200 includes the core structure 238, which is similar to the core structure 104 depicted in FIG. 1E. A solder mask layer 236 has been patterned to form a capacitor mask open 240 according to an embodiment. The solder mask layer 236 has also been patterned to form a PTH mask open 242 according to an embodiment. A flip-chip 244 with an active surface 246 and a backside surface 248 is depicted by the directional arrows as being brought together with the core structure 238. The flip-chip 244 includes a solder bump 250 that is configured to match the patterning of the capacitor mask open 240 according to an embodiment. Other occurrences of the solder bump 250 are configured to match the patterning of the PTH mask open 242 according to an embodiment.

In an embodiment, no patterning of the solder mask layer 236 is used, rather, the solder mask layer 236 is B-staged. Thereafter, the flip-chip 244 with the solder bumps 250 is pressed into the solder mask layer 236 and electrical contact is made by displacing the solder mask layer 236 in the location that would otherwise be prepared by the capacitor mask open 240 and the PTH mask open 242.

FIG. 2B is the elevational cross-section the chip package 200 depicted in FIG. 2A after processing according to an embodiment. The chip package 201 illustrates the bringing together of the flip-chip 244 with the core structure 238. Thereafter, an underfill material 252 is inserted between the flip-chip 244 and the core structure 238 to protect electrical connections and other structures.

FIG. 3 is an elevational cross-section of a chip package 300 with an embedded-in-core capacitor according to an embodiment. Similar to the chip package 201 depicted in FIG. 2A, a flip-chip 344 and a core structure 338 are mated. In this embodiment, the plurality of solder bumps 350 is about double that depicted in FIG. 2B. Accordingly, two occurrences of solder bumps 350 impinge a top electrode 330 that is embedded in the core structure 338. An underfill material 352 is inserted between the flip-chip 344 and the core structure 338 to protect electrical connections and other structures.

FIG. 4A is a cross-section elevation of a wire-bond mounting substrate (WBMS) 400 during processing according to an embodiment. The WBMS 400 includes a WBMS core 454, a top coating 456, and a bottom coating 458 according to an embodiment. In an embodiment, the WBMS 400 is selected for hand-held device manufacture such as a wireless device. The WBMS 400 includes a first bond finger 460 pad according to an embodiment. Similarly where the WBMS 400 is selected to have a capacitor therein the WBMS 400 includes a bottom electrode 432. In an embodiment, the WBMS 400 includes a second bond finger 462 pad.

FIG. 4B is a cross-section elevation of the WBMS 400 depicted in FIG. 4A after preparing a solder-mask film 464 according to an embodiment. The WBMS 401 includes a first mask 466 that has been patterned to correspond with occurrences of the bottom electrode 432. First patterning of the solder-mask film 464 is illustrated to remove all of the solder-mask film 464 that is exposed through the first mask 466.

FIG. 4C is a cross-section elevation of the WBMS 401 depicted in FIG. 4B after second patterning of the solder-mask film 465 according to an embodiment. The WBMS 402 includes a dielectric film 468 that has covered the bottom electrode 432. The dielectric film 468 is selected to have a high permittivity according to a embodiment. In an embodiment, the patterning scheme depicted in FIG. 4C is used to lay down a plating seed layer on the dielectric film 468 before removal of the first mask 466.

FIG. 4D is a cross-section elevation of the WBMS 402 depicted in FIG. 4C after further processing according to an embodiment. The WBMS 403 has been processed by second patterning the solder mask film 464 depicted in FIG. 4C to obtain a second-patterned solder mask film 465. A second mask 470 has been used that not only exposes the first bond-finger pad 460 and the second bond-finger pad 462, but has also exposes a die land 472 at about the center of the WBMS 403 according to an embodiment.

FIG. 4E is a cross-section elevation of the core support structure 403 depicted in FIG. 4D after further processing according to an embodiment. The core structure 404 has been cleared of the second mask 470. In an embodiment, the core structure 404 after formation of the dielectric film 468 exhibits a dielectric first surface 474 and a structural layer first surface 476 that are not necessarily coplanar. In an embodiment, the core structure 404 after formation of the dielectric film 468 exhibits a dielectric second surface 478 and a structural layer second surface 480 that are substantially coplanar.

FIG. 4F is a cross-section of the core support structure 404 depicted in FIG. 4E after further processing according to an embodiment. The support structure 405 includes a top electrode 482 that has been plated above the dielectric film 468. Similarly, the first bond-finger pad 460 has been plated with a first bond-finger upper 484, as well as the second bond-finger pad 462 has been plated with a second bond-finger upper 486. In an embodiment, plating was done by providing a third mask 488. In an embodiment, the top electrode 482, the first bond-finger upper 484, and the second bond-finger upper 486 were patterned from a single plated film and patterning was essentially the inverse of the third mask 488.

FIG. 4G is a cross-section elevation of the core support structure 404 depicted in FIG. 4E after further processing according to an embodiment. The core support structure 405 has been processed to seat a die 490 upon the die land 472. The core support structure 405 is prepared at this process stage to receive a wire-bonding coupling of the die 490 to the core support structure 405.

In an embodiment, the bottom electrode 432 is part of a ground ring 432 in the core support structure 405, and the first bond pad 460 is part of a power ring 460. In an embodiment, the bottom electrode 432 is part of a power ring 432 in the core support structure 405, and the first bond pad 460 is part of a ground ring 460. Together, the power ring and ground ring provide electrical conduits for sufficient power supply to the die 490 according to an embodiment.

Although the top electrode 482 and the bottom electrode 432 are depicted as part of a capacitor, other structures such as an embedded inductor or an embedded resistor can be similarly fabricated according to various embodiments.

FIG. 5 is a top plan of a solder-mask embedded capacitor in a substrate 500 according to an embodiment. The section line 4G-4G provides a cross-section elevation taken from a structure similar to the core support structure 405 in FIG. 4G. A die 590 is disposed upon the substrate 500 at a die land position. A power ring 532 is depicted in phantom lines as surrounding the die 590. A ground ring 560 is also depicted in phantom lines as surrounding the power ring 532 and the die 590. An upper electrode 582 is exposed through a solder mask 565, which may be a second-patterned solder mask film such as the second-patterned solder mask film 465 depicted in FIG. 4G. A first bond-finger upper 584 is also depicted as exposed through the solder mask 565. The upper electrode 582 and the first bond-finger upper 584 appear to be an integral structure such as is illustrated for the upper electrode 482 and the first bond-finger upper 484 in FIG. 4G.

Electrical communication between the die 590 and the substrate 500 is carried out between a first die bond finger 592 and the first bond-finger upper 584, by a first bond wire 594. Electrical communication between the die 590 and the substrate 500 is also carried out between a second die bond finger 596 and the second bond-finger upper 586, by a second bond wire 598. Accordingly, an embedded passive device, for example a parallel-plate capacitor is manufactured without adding to the vertical form factor of the core support structure 500 according to an embodiment.

Figure 6:
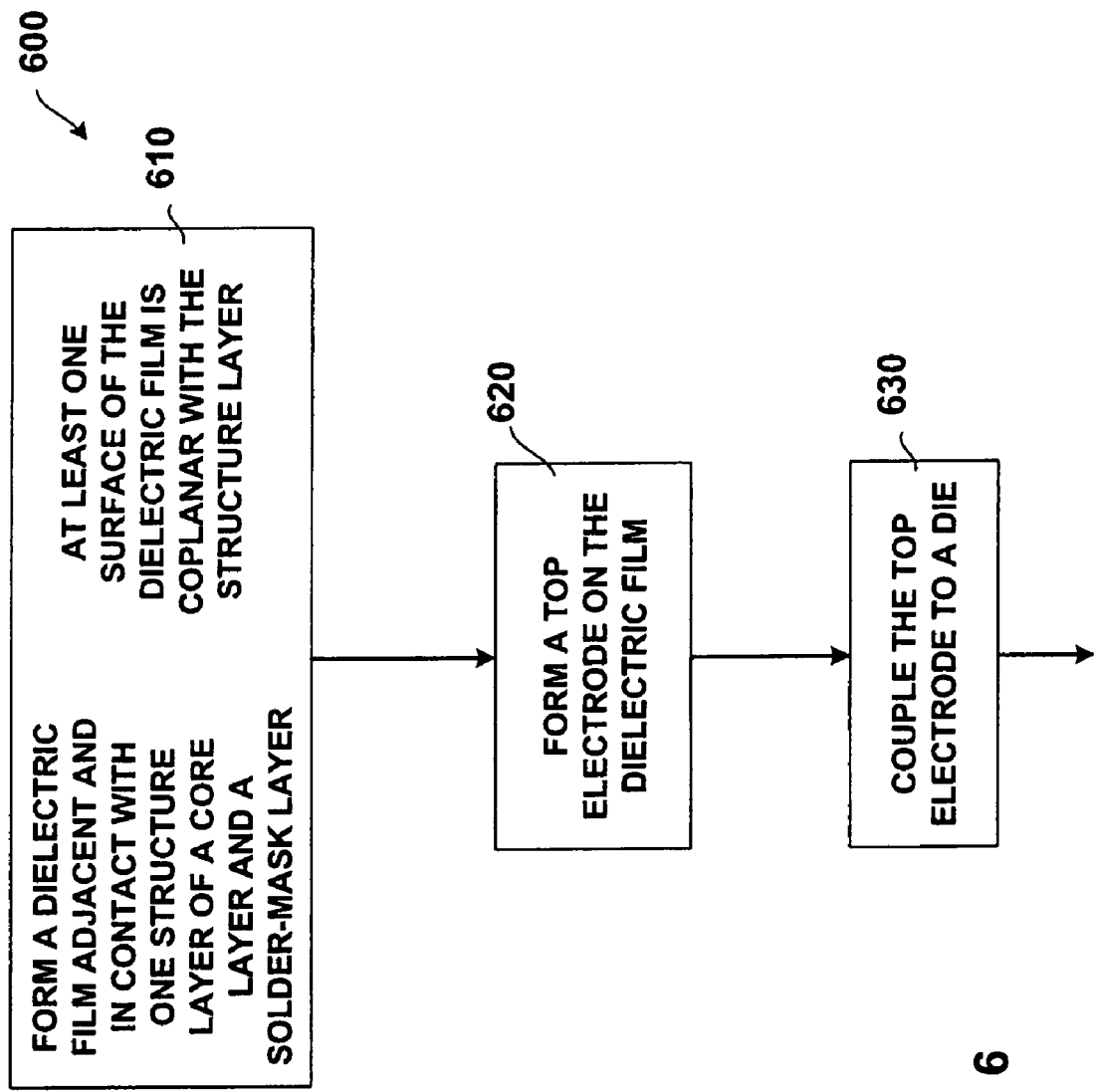
FIG. 6 is a flow chart that describes method flow embodiments.

FIG. 6 is a flow chart 600 that describes method flow embodiments.

At 610, the process includes forming a dielectric film adjacent and in contact with a structural layer that is one of a solder mask and a core.

At 620, the process includes forming a top electrode on the dielectric film. In an embodiment, the process commences at 610 and terminates at 620.

At 630, the process includes coupling the top electrode to a die. In an embodiment, the process terminates at 630.

Figure 7:
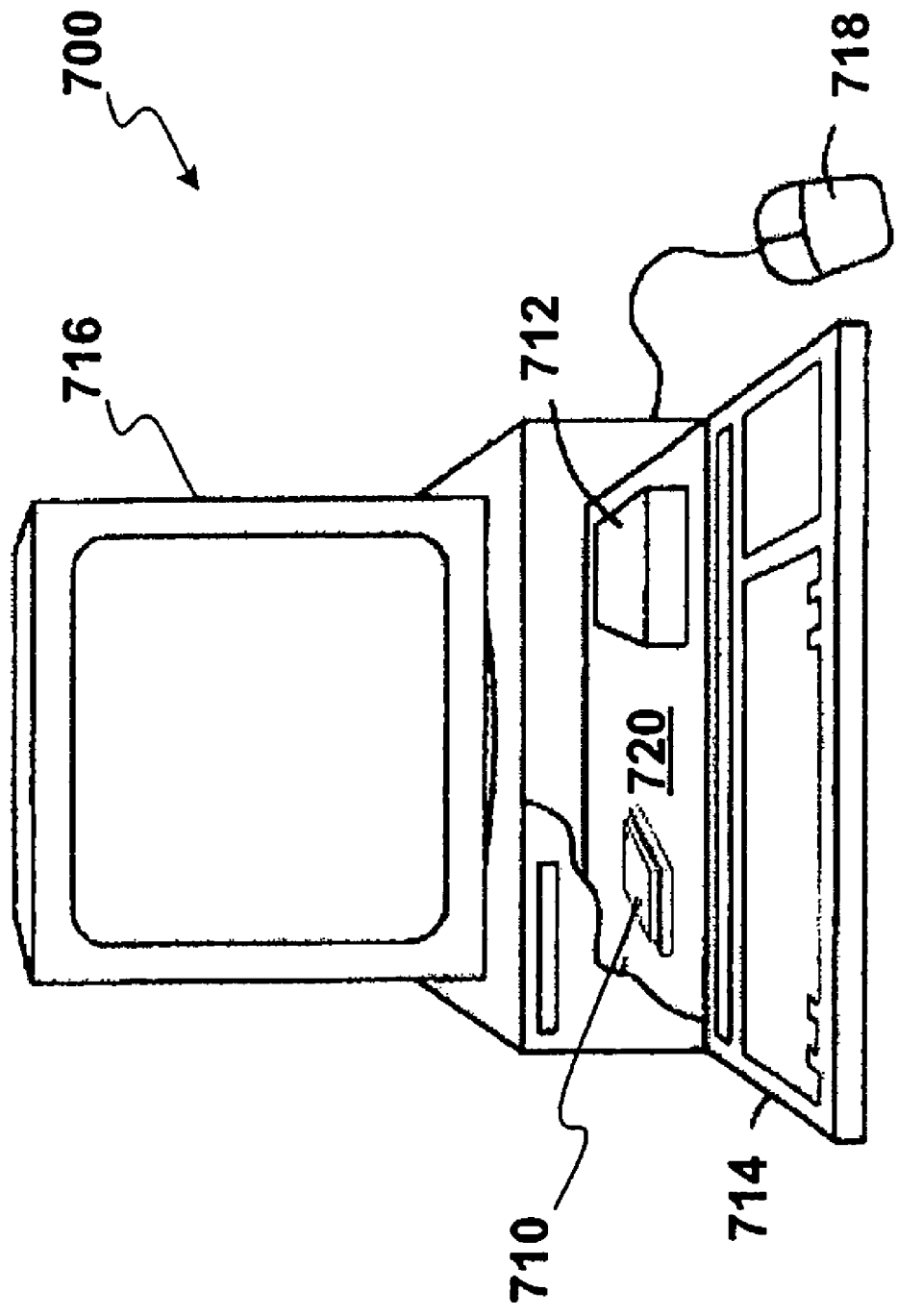
FIG. 7 is a cut-away elevation that depicts a computing system according to an embodiment.

FIG. 7 is a cut-away elevation that depicts a computing system 700 according to an embodiment. One or more of the foregoing embodiments of the core-embedded passive device or the solder-mask embedded passive device may be utilized in a computing system, such as a computing system 700 of FIG. 7. Hereinafter any core-embedded passive device or the solder-mask embedded passive device embodiment alone or in combination with any other embodiment is referred to as an embodiment(s) configuration.

The computing system 700 includes at least one processor (not pictured), which is enclosed in an IC chip package 710, a data storage system 712, at least one input device such as a keyboard 714, and at least one output device such as a monitor 716, for example. The computing system 700 includes a processor that processes data signals, and may include, for example, a microprocessor, available from Intel Corporation. In addition to the keyboard 714, the computing system 700 can include another user input device such as a mouse 718, for example. The computing system 700 can include a structure, after processing as depicted in FIGS. 1G, and 2-5 the given core-embedded passive device or the solder-mask embedded passive device embodiment.

For purposes of this disclosure, a computing system 700 embodying components in accordance with the claimed subject matter may include any system that utilizes a microelectronic device system, which may include, for example, at least one of the core-embedded passive device or the solder-mask embedded passive device embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 712.

In an embodiment, the computing system 700 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 720. In this embodiment, an embodiment(s) configuration is coupled to the DSP, and a separate embodiment(s) configuration may be present that is coupled to the processor in the IC chip package 710. Additionally in an embodiment, an embodiment(s) configuration is coupled to a DSP that is mounted on the same board 720 as the IC chip package 710. It can now be appreciated that the embodiment(s) configuration can be combined as set forth with respect to the computing system 700, in combination with an embodiment(s) configuration as set forth by the various embodiments of the core-embedded passive device or the solder-mask embedded passive device within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

Figure 8:
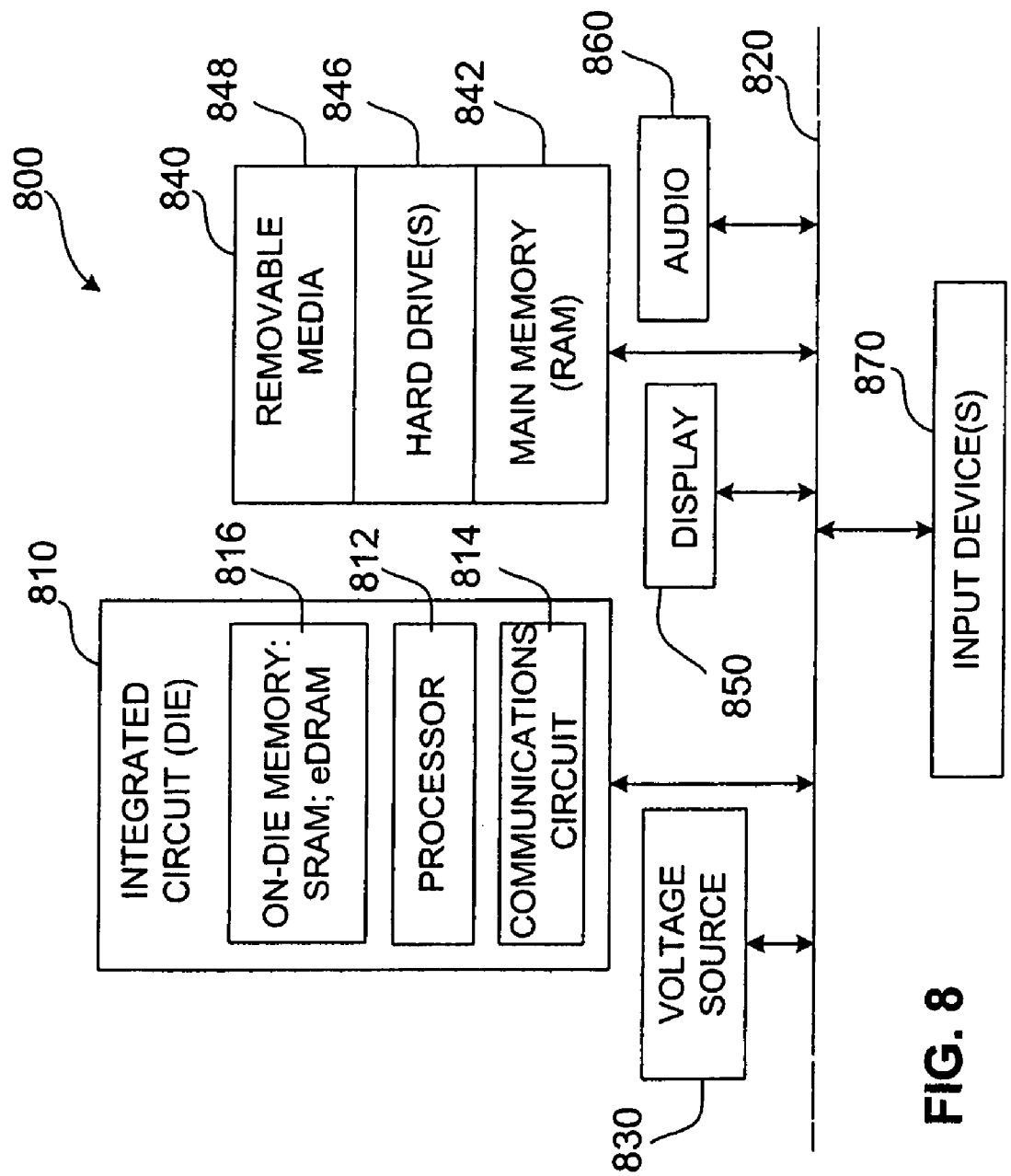
FIG. 8 is a schematic of a computing system according to an embodiment.

FIG. 8 is a schematic of an electronic system 800 according to an embodiment. The electronic system 800 as depicted can embody the computing system 700 depicted in FIG. 7, but the electronic system is depicted more generically. The electronic system 800 incorporates at least one electronic assembly 810, such as an IC die illustrated in FIGS. 2-5. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 means any type of circuit such as, but not limited to, a microprocessor, a microcontroller, a graphics processor, a digital signal processor, or another processor. Other types of circuits that can be included in the integrated circuit 810 are a custom circuit or an ASIC, such as a communications circuit 814 for use in wireless devices such as cellular telephones, pagers, portable computers, two-way radios, and similar electronic systems. In an embodiment, the processor 810 includes on-die memory 816 such as SRAM. In an embodiment, the processor 810 includes on-die memory 816 such as eDRAM.

In an embodiment, the electronic system 800 also includes an external memory 840 that in turn may include one or more memory elements suitable to the particular application, such as a main memory 842 in the form of RAM, one or more hard drives 826, and/or one or more drives that handle removable media 848, such as diskettes, compact disks (CDs), digital video disks (DVDs), flash memory keys, and other removable media known in the art.

In an embodiment, the electronic system 800 also includes a display device 850, an audio output 860. In an embodiment, the electronic system 800 includes a controller 870, such as a keyboard, mouse, trackball, game controller, microphone, voice-recognition device, or any other device that inputs information into the electronic system 800.

As shown herein, integrated circuit 810 can be implemented in a number of different embodiments, including an electronic package, an electronic system, a computer system, one or more methods of fabricating an integrated circuit, and one or more methods of fabricating an electronic assembly that includes the integrated circuit and the RF-passive device-containing layer as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
    a bottom electrode;
    a dielectric film including a first surface and a second surface, wherein the dielectric film is disposed above and on the bottom electrode;
    a structural layer disposed adjacent and in contact with the dielectric film, wherein the structural layer is substantially coplanar with the dielectric film on at least one of the first surface and the second surface, and wherein the structural layer is at least one of a solder mask and a core layer; and
    a top electrode disposed above and on the dielectric layer.

2. The article of claim 1, wherein the bottom electrode is coupled to one of a power ring and a ground ring in a package.

3. The article of claim 1, wherein the bottom electrode is a portion of a ground ring in a package, and wherein the top electrode is a portion of a power ring in the package.

4. The article of claim 1, wherein the dielectric film and the structural layer have substantially the same composition.

5. The article of claim 1, wherein the structural layer is a core layer, the core layer further including a plated through hole adjacent the dielectric film and spaced apart from the dielectric film by the core layer.

6. The article of claim 1, wherein the structural layer is a core layer, the core layer further including a plated through hole adjacent the dielectric film and spaced apart by the core layer, the article further including an encapsulation layer disposed over at least one of the top electrode and the bottom electrode.

7. The article of claim 1, wherein the structural layer is a core layer, the article further including:
a first solder bump in contact with the top electrode; and
a die in contact with the first solder bump.

8. The article of claim 1, wherein the structural layer is a core layer, the core layer further including a plated through hole adjacent the dielectric film and spaced apart from the dielectric film by the core layer, the article further including:
a first solder bump coupled to the top electrode;
a first die coupled to the first solder bump;
a second solder bump coupled to the plated through hole; and
the second solder bump coupled to the first die.

9. A system comprising:
a bottom electrode;
a dielectric film including a first surface and a second surface, wherein the dielectric film is disposed above and on the bottom electrode;
a structural layer disposed adjacent and in contact with the dielectric film, wherein the structural layer is substantially coplanar with the dielectric film on at least one of the first surface and the second surface, and wherein the structural layer is at least one of a solder mask and a core layer;
a top electrode disposed above and on the dielectric film;
a die coupled to the top electrode; and
dynamic random-access memory coupled to the die.

10. The system of claim 9, wherein the die is disposed in a solder-mask layer.

11. The system of claim 9, wherein the structural layer is a core layer, and further including a plated through-hole disposed adjacent the dielectric film, and spaced apart from the dielectric film by the core layer.

12. The system of claim 9, wherein the system is disposed in one of a computer, a wireless communicator, a hand-held device, an automobile, a locomotive, an aircraft, a watercraft, and a spacecraft.

13. The system of claim 9, wherein the die is selected from a data storage device, a digital signal processor, a micro controller, an application specific integrated circuit, and a microprocessor.

14. An article comprising:
a bottom electrode, wherein the bottom electrode is a portion of a ground ring in a package;
a dielectric film including a first surface and a second surface, wherein the dielectric film is disposed above and on the bottom electrode;
a structural layer disposed adjacent and in contact with the dielectric film, wherein the structural layer is substantially coplanar with the dielectric film on at least one of the first surface and the second surface, wherein the structural layer is a core layer, the core layer further including a plated through hole adjacent the dielectric film and spaced apart from the dielectric film by the core layer; and
a top electrode disposed above an on the dielectric film, wherein the top electrode is a portion of a power ring in the package.

15. The article of claim 14, wherein the dielectric film and the structural layer have substantially the same composition.

16. The article of claim 14, the article further including an encapsulation layer disposed over at least one of the top electrode and the bottom electrode.

17. The article of claim 14, the article further including an encapsulation layer disposed over the top electrode and the bottom electrode.

18. The article of claim 14, the article further including:
a first solder bump in contact with the top electrode; and
a die in contact with the first solder bump.

19. The article of claim 14, the article further including:
a first solder bump coupled to the top electrode;
a die coupled to the first solder bump;
a second solder bump coupled to the plated through hole; and
the second solder bump coupled to the die.

20. An article comprising:
a bottom electrode, wherein the bottom electrode is a portion of a ground ring in a package;
a dielectric film including a first surface and a second surface, wherein the dielectric film is disposed above and on the bottom electrode;
a structural layer disposed adjacent and in contact with the dielectric film, wherein the structural layer is substantially coplanar with the dielectric film on at least one of the first surface and the second surface, wherein the structural layer is a core layer, the core layer further including a plated through hole adjacent the dielectric film and spaced apart from the dielectric film by the core layer;
a top electrode disposed above an on the dielectric film, wherein the top electrode is a portion of a power ring in the package;
a first solder bump coupled to the top electrode;
a die coupled to the first solder bump;
a second solder bump coupled to the plated through hole;
the second solder bump coupled to the die; and
an encapsulation layer disposed over the top electrode and the bottom electrode.

21. The article of claim 20, wherein the dielectric film and the structural layer have substantially the same composition.

22. The article of claim 20, further including dynamic random-access memory coupled to the die.

* * * * *